March 30, 1965 J. J. TIEMANN 3,176,163
SOLID STATE CIRCUIT INTERRUPTER HAVING A MULTILAYER SWITCHING DEVICE AND TUNNEL DIODE CURRENT SENSING MEANS THEREFOR
Original Filed March 24, 1960
Fig. 1.
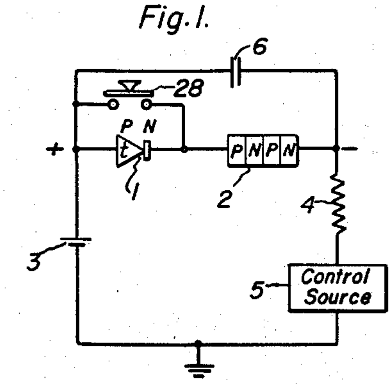
Fig. 2.
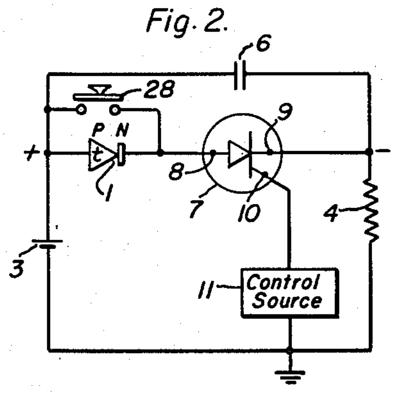
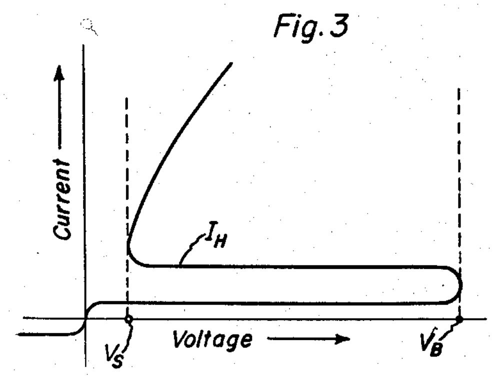
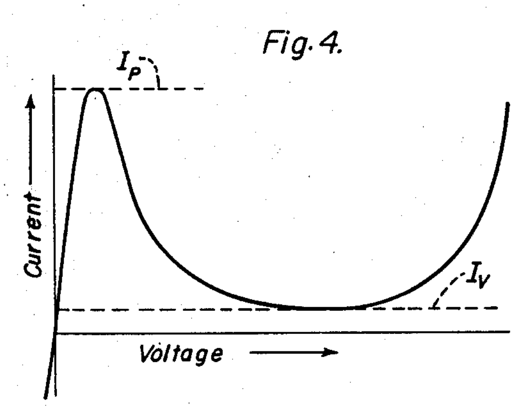
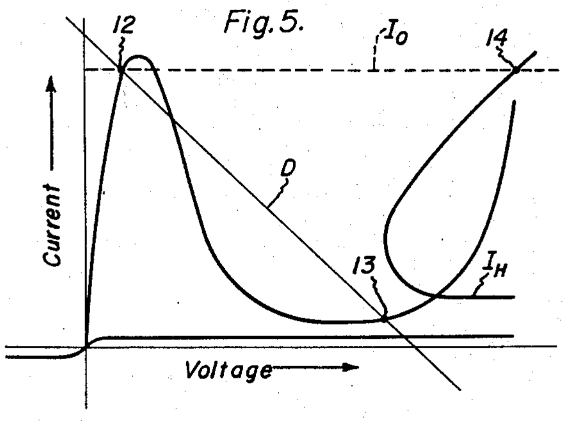
Fig. 6.
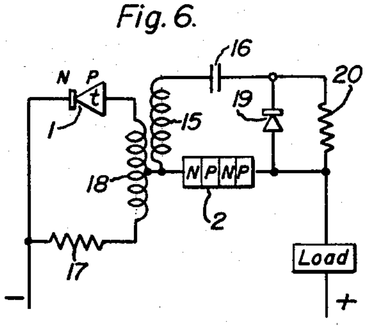
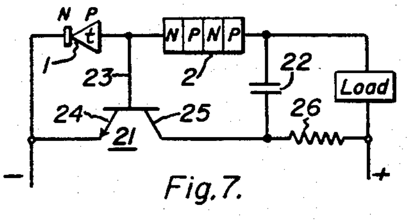
Inventor:
Jerome J. Tiemann,
by John F. Ahern
His Attorney.

United States Patent Office 3,176,163
Patented Mar. 30, 1965

3,176,163

SOLID STATE CIRCUIT INTERRUPTER HAVING A MULTILAYER SWITCHING DEVICE AND TUNNEL DIODE CURRENT SENSING MEANS THEREFOR

Jerome J. Tiemann, Burnt Hills, N.Y., assignor to General Electric Company, a corporation of New York Original application Mar. 24, 1960, Ser. No. 17,432. Divided and this application Mar. 12, 1964, Ser. No. 358,135
3 Claims. (Cl. 307—88.5)

This application is a division of my application Serial No. 17,432, filed March 24, 1960 entitled "Solid State Circuit Interrupter." This invention relates to circuit arrangements which include semiconductor elements and, more particularly, to such arrangements in which the semiconductor elements are capable of operation in both high and low impedance conditions so as to provide switching or circuit interrupting functions.

In the operation of many electrical systems there is need for a small and reliable circuit arrangement which can be changed quickly and automatically from a low impedance condition, whereby a large current may flow, to a high impedance condition, which limits the current to a very small value without employing mechanical contacts or other moving parts.

The semiconductor devices used in the practice of this invention are of two different negative resistance types called "current-controlled" and "voltage-controlled" negative resistance devices. The type of negative resistance device is determined with respect to the ordinate which intercepts its current-voltage characteristic at only one point. Examples of "current-controlled" negative resistance semiconductor devices are: controlled rectifiers, PNPN diodes and unijunction and avalanche transistors all of which are now well-known in the art. Some of these devices, such as P-N-P-N diodes and controlled rectifiers, for example, comprise a semiconductive body having four zones, contiguous zones being of opposite conductivity type and defining at least three P-N junctions. Electrodes may be provided to the two end zones or to the two end zones and one of the intermediate zones. Current controlled negative resistance devices may also be provided by appropriate cascading of transistors. A further description of semiconductor devices of the above type is found in an article by J. M. Moll, M. Tanenbaum, J. M. Goldey and N. Holonyak in the September 1956 Proceedings of the I.R.E., entitled "P-N-P-N Transistor Switches," pages 1174–1182. All such semiconductor devices of this type are referred to herein as "multilayer semiconductor devices."

The "voltage-controlled" semiconductor device used in the practice of this invention is the so-called "tunnel diode" or narrow junction degenerate semiconductor diode. Such diodes are semiconductor devices including a single P-N junction and exhibiting a region of negative resistance in the low forward voltage range of their current-voltage characteristics.

Devices of this type are fabricated so as to provide regions of P and N-type conductivity having a very narrow junction therebetween. Both of the regions of the device are "degenerate." The use of the term degenerate refers to a body or region of semiconductive material which, if N-type, contains a sufficient concentration of excess donor impurity to raise the Fermi-level thereof to a value of energy higher than the minimum energy of the conduction band on the energy band diagram for the semiconductive material. In a P-type semiconductive body or region degeneracy means that a sufficient concentration of excess acceptor impurities are present therein to depress the Fermi-level to an energy lower than the maximum energy of the valence band on the energy band diagram for the semiconductive material. The Fermi-level in such an energy band diagram is the energy level at which the probability of there being an electron present is equal to one-half.

The forward voltage range wherein the negative resistance region appears varies depending upon the semiconductive material from which the device is fabricated. For example, the range of the negative resistance region is from about 0.04 to 0.3 volt for germanium; about 0.08 to 0.4 volt for silicon, about 0.03 to 0.3 volt for gallium antimonide, and about .15 to .6 volt for gallium arsenide.

For further details concerning the narrow junction degenerate semiconductor device utilized in the practice of this invention reference may be had to my copending application Serial No. 858,995, filed December 11, 1959, which is assigned to the assignee of the present invention and incorporated herein by reference. The aforementioned application has been abandoned in favor of a continuation-in-part application Serial No. 74,815, filed September 9, 1960, which discloses and claims the subject matter of the parent application.

Circuit arrangements are known employing semi-conductor devices in combination with control voltage sources to provide switching between two extreme impedance conditions. A typical circuit arrangement utilizes a PNPN diode and a suitable voltage source capable of producing both positive and negative output pulses to switch the PNPN device "on" and "off," in addition to an accompanying sensing means to excite the control voltage source to produce a pulse of appropriate polarity to cause the semiconductor device to switch to its different impedance conditions. This pulse source and sensing means contributes to the complexity of the complete circuit interrupter arrangement and requires a variety of components.

It is an object of this invention, therefore, to provide a new and improved solid state circuit interrupter arrangement which avoids one or more of the above disadvantages.

It is another object of this invention to provide a circuit arrangement which automatically switches from a low impedance condition to a high impedance condition whenever a predetermined current level has been exceeded.

It is an object of this invention to provide a new and improved circuit interrupter which combines simplicity and economy of components.

It is still another object of this invention to provide a current-threshold circuit interrupter which is suitable for large power requirements and makes possible a high degree of miniaturization.

Briefly stated, in accordance with one aspect of this invention, a solid state circuit interrupter comprises a narrow junction degenerate semiconductor diode, hereafter referred to as a "narrow junction diode," and a multilayer semiconductor device connected in series with a circuit to be interrupted. The multilayer device and narrow junction diode both have high and low impedance conditions of operation. Means are provided to initiate current in the circuit by setting the diode and multilayer device to their low impedance conditions. Means are further provided which are responsive to the condition of the narrow junction diode to impress a voltage across the multilayer device of a polarity and duration sufficient to allow the device to recover to its high impedance condition whenever the narrow junction diode changes from its low to its high impedance condition. The narrow junction diode is caused to change from its low to its high impedance condition whenever the current in the circuit to be interrupted exceeds a predetermined value.

The novel features which I believe to be characteristic of my invention are set forth with particularity in the appended claims. My invention itself, however, together with further objects and advantages thereof will best be understood by reference to the following description taken in conjunction with the accompanying drawings wherein like numerals designate like components and in which:

FIG. 1 is a schematic diagram of one embodiment of the circuit interrupter of this invention, FIG. 2 is a schematic diagram of an embodiment utilizing a controlled rectifier as the particular multilayer semiconductor device showing means for switching the device to its high conduction state, FIG. 3 is a typical current-voltage characteristic of a current-controlled negative resistance multilayer semiconductor device such as may be utilized in the practice of this invention, FIG. 4 is a typical current-voltage characteristic of a narrow junction degenerate semiconductor diode such as used in this invention, FIG. 5 is a graphical representation of the current voltage characteristics of the two semiconductor devices utilized in the practice of this invention illustrating the operating points for the circuit arrangement of this invention, and FIGS. 6 and 7 are schematic diagrams of further embodiments of this invention.

FIG. 1 shows a narrow junction degenerate semiconductor diode 1 and a multilayer semiconductor device 2 connected in series with a voltage supply 3, a utilization means, represented schematically by resistance 4 and a control voltage source 5. Semiconductor devices 1 and 2 are connected with respect to each other to provide that the forward current is in the same direction. For example, for one polarity the N-type conductivity region of narrow junction diode 1 is connected to the end P-type conductivity region of multilayer semiconductor device 2 while for the other polarity of P-type conductivity region of narrow junction diode 1 is connected to the end N-type conductivity region of the multilayer semiconductor device 2. For either polarity condition, therefore, narrow junction diode 1 and multilayer device 2 provide alternate regions of opposite conductivity type. Means are provided which are responsive to the voltage across diode 1 for impressing a voltage across the multilayer device 2 of a polarity and duration sufficient to allow device 2 to recover to its high impedance condition. This may be by means of capacitance 6 connected in parallel with the series-connected diode and multilayer device. The push-button 28 is not essential to the operation of the circuit and is shown merely as one convenient means of momentarily by-passing the discharge current from capacitance 6 which might tend to switch diode 1 to its high impedance condition when current is initiated in the circuit. The above are all the components required for this new and improved solid state circuit interrupting arrangement. No separate power supply is required since the low power consumed is drawn from the current to be interrupted. Thus, an extremely simple and compact circuit interrupter is provided.

It is a characteristic of the multilayer semiconductor devices used in this invention that they remain in a high impedance condition until a critical breakdown voltage has been exceeded. When this voltage is exceeded, however, the device switches to a low impedance or high conduction state and remains in this state if sufficient voltage is maintained across its terminals to insure the flow of a minimum amount of current called its "holding current." The voltage necessary to sustain this current is called the sustaining voltage and is very small as compared to the critical breakdown voltage, being usually on the order of one volt or less, depending upon the exact semiconductor devices utilized.

In FIG. 2 there is shown a circuit interruptor in accordance with this invention employing a controlled rectifier as the particular multilayer device. The controlled rectifier, as described above, is likewise a multilayer semiconductor device, however, it is caused to switch to its high conduction state in a different manner. A controlled rectifier has, in addition to the electrodes contacting the two end zones, as in the PNPN diode, an electrode contacting one of the intermediate zones. These electrodes are called herein the anode electrode, cathode electrode and gate electrode respectively. Such a controlled rectifier is triggered to its high conduction state by applying a current to the gate electrode causing the controlled rectifier to switch to its high conduction state even though the voltage across the device is less than the critical breakdown voltage. For increasing values of gate electrode currents, the forward breakdown voltage is reduced until, at a sufficiently high value, the device has the characteristics of an ordinary P-N junction rectifier. Although the operation of the circuit arrangements of both FIGS. 1 and 2 are substantiallly the same, the controlled rectifier shown in FIG. 2 is set to its high conduction state by supplying a current to the gate electrode rather than applying a voltage pulse across its terminals, as is the case with respect to the multilayer device in the arrangement of FIG. 1.

In the circuit interrupter arrangement of FIG. 2, therefore, there is shown narrow junction diode 1 connected electrically in series with a controlled rectifier 7. Controlled rectifier 7 includes an anode electrode 8, a cathode electrode 9 and a gate electrode 10. Again, as in FIG. 1 capacitance 6 shunts the series-connected semiconductor devices 1 and 7 and this parallel combination is connected in series with a circuit to be interrupted. The circuit to be interrupted is represented schematically by voltage supply 3, and resistance 4. The controlled rectifier 7 is triggered to its high conduction state, to initiate current in the circuit, by supplying current to gate electrode 10 from current source 11 causing the device to switch to its high conduction state.

If the current through the multilayer device in either of the arrangements of FIG. 1 or 2 is reduced to a value less than that of the minimum holding current or the voltage thereacross is reduced to a value less than that required to sustain such holding current, the multilayer device returns to its high impedance state and remains there until breakdown is again initiated and the multilayer device is caused to switch to its low impedance or high conduction state. The breakdown voltage $V_B$, sustaining voltage $V_S$ and minimum value of holding current $I_H$ are shown particularly on the current-voltage characteristic for a typical multilayer semiconductor device in FIG. 3.

The current-voltage characteristic of a typical narrow junction degenerate semiconductor diode is shown in FIG. 4. The voltages at which the peak current $I_P$ and the valley current $I_V$ occur depend upon the particular semiconductive material from which the narrow junction degenerate semiconductor device is fabricated. The magnitude of these currents, however, depends upon such factors as the junction area, bulk resistance of the semiconductive material and various other details and techniques of fabrication. It is possible, therefore, to obtain such devices with many different values of peak and valley current. For purposes of this invention, the particular narrow junction diode utilized must have a valley current less than the minium holding current of the multilayer semiconductor device used in combination with it. The narrow junction diode is selected, in addition, to have a peak current corresponding to the threshold level above which it is desired to provide automatic circuit interruption.

Since both the circuit arrangements shown in FIGS. 1 and 2 have substantially the same mode of operation, the following description has reference primarily to the circuit arrangement of FIG. 1. In the operation of the circuit arrangements shown in FIGS. 1 and 2 current is established in the circuit by causing the multilayer device to be switched to its low impedance or high conduction state. This may be provided, for such devices as the PNPN diode and unijunction and avalanche transistors, by means of a voltage pulse such as, for example, from control source 5. This provides that the net voltage across the device exceeds the critical breakover voltage causing breakdown of the junction and switching of the device to its high conduction state. Alternatively, such switching may be provided by means of an external voltage pulse either superimposed on the supply voltage or impressed directly across the multilayer device. This switching may also be provided, when utilizing a controlled rectifier such as shown in FIG. 2, by supplying current to the gate electrode 10 from current source 11 causing the device to switch to its high conduction state at a voltage less than its critical breakdown voltage.

Means are provided which are responsive to the voltage condition of narrow junction diode 1 for impressing a voltage across the multilayer device 2 which reduces the net voltage across its terminals to a value less than the voltage required to sustain the multilayer device in its high conduction state. The circuit arrangement illustrated in FIG. 1 comprises a capacitance 6 in parallel with the series connected narrow junction diode 1 and multilayer device 2. Since capacitance 6 is in parallel with the series combination of semiconductor devices 1 and 2 the voltage is the same across both branches. For convenience of description, these branches are referred to herein as the capacitance and semiconductor branches, respectively.

The current in the semiconductor branch establishes a load line for narrow junction diode 1 such as shown in FIG. 5 at D. This load line intersects the narrow junction diode current-voltage characteristic in a region of low positive resistance shown at 12 and a region of high positive resistance shown at 13. Since both these intersections are in regions of positive resistance, the load line D provides narrow junction diode 1 with two stable conditions of operation. Because of the nature of the negative resistance region of the characteristic, for a load line such as that shown at D, there can be no stable operation in the negative resistance region and the only conditions of operation are at the low and high impedance conditions 12 and 13 respectively.

Current is established in the circuit to be interrupted by setting multilayer device 2 and narrow junction diode 1 to their low impedance conditions, as described above, and is maintained until interrupted. Diode 1 is selected to have a value of peak current corresponding to a value above which it is desired to provide automatic circuit interruption. As long as the current in the circuit to be interrupted remains at a value less than the peak current of diode 1, the semiconductor branch remains in a low impedance condition and this amount of current is carried by the series connected semiconductor devices 1 and 2. Since semiconductor devices 1 and 2 are in series, they each carry the total current of the semiconductor branch at all times. The current in diode 1 for the operating point 12 and in multilayer device 2 for point 14 is shown as $I_0$ on the curves of FIG. 5. When the current in the circuit to be interrupted reaches a value which would result in a narrow junction diode current in excess of the diode's peak current, the diode abruptly switches to its other stable operating condition 13 reducing the current in the semiconductor branch to a value less than the minimum holding current $I_H$ of the multilayer device 2. If the current is held at this value for a short period of time, the multilayer device recovers to its high impedance condition, effectively interrupting the current in the circuit. In the circuit arrangements shown in FIGS. 1 and 2 the voltage across multilayer device 2 is reduced to a value below that corresponding to its sustaining voltage and held at this voltage for a short period of time by capacitance 6.

When diode 1 changes from its low impedance operating point 12 to its higher impedance operating point 13, there is an abrupt change resulting in a higher voltage appearing across the terminals of narrow junction diode 1.

As a particular example assume initially that both narrow junction diode 1 and multilayer device 2 are in their low impedance conditions and there is appreciable current in the circuit to be interrupted. For the load line D shown in FIG. 2, for a particular narrow junction diode, the voltage corresponding to point 12 may be approximately 0.08 volt and the voltage corresponding to point 13 approximately 0.7 volt. There is a change in voltage when narrow junction diode 1 switches from its low impedance condition at point 12 to its higher impedance condition at point 13 of 0.62 volt. For a particular multilayer device 2 for this same example the sustaining voltage $V_s$ may be approximately 0.7 volt and the voltage corresponding to point 14 approximately 1.0 volt. Thus a voltage change in excess of 0.3 volt will reduce the voltage across the multilayer device 2 below its minimum sustaining voltage. The voltage change of 0.62 volt across narrow junction diode 1, therefore, is sufficient to decrease the voltage across multilayer device 2 to a value below its sustaining voltage $V_s$.

Since the voltage across capacitance 6 cannot change instantaneously the voltage across the semiconductor branch tends to remain constant when narrow junction diode 1 is caused to switch from its low impedance condition to its higher impedance condition. The voltage across the multilayer device, therefore, must decrease by an amount equal in magnitude to the increase in voltage across narrow junction diode 1. Multilayer device 2 is so selected, therefore, that the difference between the minimum sustaining voltage, $V_s$, and the voltage corresponding to its operating point 14 is less than the difference in voltage due to the change of condition of narrow junction diode 1. Thus, the voltage across multilayer device 2 is reduced to a value less than the sustaining voltage $V_s$ necessary to maintain the multilayer device in its high conduction state. This condition persists during the time capacitance 6 is being charged in response to the increased voltage across narrow junction diode 1. Capacitance 6 is selected to have a charging time sufficient to allow multilayer device 2 to recover to its high impedance condition where it remains and the current in the circuit is effectively interrupted.

The time required to allow multilayer device 2 to recover to its high impedance condition is very short and the circuit interrupter arrangement of this invention is capable of extremely high speed operation. For example, for a typical silicon controlled rectifier, the time the rectifier voltage must be held below the minimum sustaining voltage to allow recovery to the high impedance condition is on the order of $10^{-5}$ seconds.

FIGS. 6 and 7 show additional means for utilizing the voltage change across diode 1 to allow the multilayer device 2 to recover to its high impedance condition. In FIG. 6, for example, the means utilized is an inductance 15 and capacitance 16 in series combination across multilayer device 2. Multilayer device 2 is connected in series with a current-threshold sensing circuit arrangement which includes diode 1 and resistance 17 connected in parallel relationship by inductance 18. When such a parallel combination is connected in series with a circuit to be interrupted, a voltage pulse is developed through inductance 18 whenever the operating condition of diode 1 is changed. For further details of such a current threshold sensing circuit arrangement, reference may be had to my copending application, Serial No. 863,142, filed December 31, 1959, and assigned to the assignee of the present invention. The voltage pulse from the sensing circuit arrangement is impressed across the multilayer device 2 through inductance 15 and capacitance 16 to allow the multilayer device to recover to its high impedance condition. Again, the charging time of capacitance 16 must be long enough to allow such recovery. If, however, the voltage of the pulse from the narrow junction diode is stepped up, such as by a transformer, for example, a smaller value of capacitance can be used. Diode 19 and resistance 20 are not essential to the operation of the circuit and merely serve to block the discharge from capacitance 16, which would, in the absence of these elements, tend to cause diode 1 to be switched to its high impedance condition when current is established in the circuit to be interrupted.

In FIG. 7, means for utilizing the voltage across narnar junction diode 1 to allow recovery of multilayer device 2 to its high impedance condition is shown as transistor 21 and capacitance 22. Transistor 21, for example, may be of N-P-N-type having base electrode 23, emitter electrode 24 and collector electrode 25. Transistor 21 is connected in circuit with narrow junction diode 1 such that transistor 21 is in a nonconducting state when narrow junction diode 1 is in its low impedance condition and in a conducting state when narrow junction diode 1 is in its high impedance condition. For example, transistor 21 may have base electrode 23 connected to one terminal of narrow junction diode 1 and emitter electrode 24 connected to the other terminal thereof. The voltage appearing across narrow junction diode 1 is thus impressed between the base and emitter electrodes of transistor 21. Collector 25 may be connected through a suitable impedance such as resistance 26 to a voltage source of positive-polarity and magnitude large compared to the forward voltage difference appearing across the multilayer device 2. This may be a separate voltage source or, conveniently, the positive terminal of the circuit to be interrupted.

When narrow junction diode 1 is in its low impedance condition only a small voltage is impressed between the base and emitter electrodes 23 and 24 respectively and substantially no injection occurs at the emitter-base junction of transistor 21. There is only a very small current in the base-collector circuit and transistor 21, therefore, is substantially non-conducting. There is also only a very small current in resistance 26 and a small voltage difference appearing thereacross. When narrow junction diode 1 is caused to switch to it high impedance condition, however, a large current is diverted to the emitter electrode 24 and transistor 21 is rendered conducting. This causes a large current in the collector circuit and in resistance 26. Because of the current in resistance 26 a large voltage difference appears across its terminals. Capacitance 22 begins to charge to this increased voltage and by this action the voltage across multilayer device 2 is driven negative. Again, the charging time of capacitance 22 is selected so that the voltage across multilayer device 2 is held below the minimum sustaining voltage $V_s$ for a time sufficient to allow the multilayer device 2 to recover to its high impedance condition. It is apparent, therefore, that this arrangement is responsive to the voltage condition of narrow junction diode 1 and is effective to maintain the voltage across multilayer device 2 at a value below the minimum sustaining voltage and allow recovery to the high impedance condition.

This invention offers circuit simplicity and economy of components. When the predetermined current value is exceeded there is an instantaneous large magnitude voltage change at diode 1 which is utilized to allow the multilayer device to recover to its high impedance condition, effectively interrupting the circuit.

While only certain preferred features of the present invention have been shown by way of illustration, many modifications and changes will occur to those skilled in the art. It is, therefore, to be understood that the appended claims are intended to cover all such modifications and changes as fall within the true spirit and scope of this invention.

What I claim as new and desire to secure by Letters Patent of the United States is:

1. A solid state circuit interrupter comprising: a multilayer semiconductor device having a low and high impedance stable operating condition; a current threshold sensing circuit arrangement including a resistance, an inductance and a narrow junction degenerate semiconductor diode having a high and low impedance condition, said inductance connecting said diode in parallel circuit relation with said resistance; means connecting said multilayer device and said current threshold sensing circuit arrangement in series with a circuit to be interrupted; means for setting said diode and multilayer device to their low impedance conditions to initiate current in said circuit; and means responsive to the output of said current threshold sensing circuit arrangement for maintaining a voltage across said multilayer device lower than its sustaining voltage for a time sufficient to allow it to recover to its high impedance condition.

2. A solid state circuit interrupter comprising: a multilayer semiconductor device having a low and high impedance stable operating condition; a current threshold sensing circuit arrangement including an inductance, a resistance and a narrow junction degenerate semiconductor diode having low and high impedance conditions, said inductance connecting said diode and said resistance in parallel circuit relationship; means connecting said multilayer device and said current threshold sensing circuit arrangement in series with a circuit to be interrupted; means for setting said diode and multilayer device to their low impedance conditions to initiate current in said circuit; and means including inductance and capacitance responsive to the output of said current threshold sensing circuit arrangement for maintaining a voltage across said multilayer device lower than its sustaining voltage for a time sufficient to allow it to recover to its low impedance condition.

3. The circuit interrupter of claim 1 wherein the means responsive to the output of said current threshold sensing circuit arrangement is a series combination of capacitance and inductance in parallel circuit relation with said multilayer device and said combination is inductively coupled to said current threshold sensing circuit arrangement.

No references cited.

JOHN W. HUCKERT, *Primary Examiner.*